United States Patent [19]
Thaxter

[11] Patent Number: 5,650,670
[45] Date of Patent: Jul. 22, 1997

[54] INDUCTION CHARGE MICROWAVE PULSE GENERATOR HAVING A SPLIT GROUND PLANE

[75] Inventor: James Bruce Thaxter, Townsend, Mass.

[73] Assignee: The United States of America as represented by the Secretary of the Air Force, Washington, D.C.

[21] Appl. No.: 508,138

[22] Filed: Jul. 27, 1995

[51] Int. Cl.⁶ .................................................. H03K 3/02
[52] U.S. Cl. ........................... 307/106; 331/173; 333/20
[58] Field of Search ................. 307/106, 98; 333/20, 333/162; 327/124, 181; 505/866; 257/199, 275, 482, 604; 331/96–102, 172, 173

[56] References Cited

U.S. PATENT DOCUMENTS

| | | | |
|---|---|---|---|
| 3,484,619 | 12/1969 | Proud, Jr. ................... | 307/106 |
| 3,670,196 | 6/1972 | Smith ....................... | 333/162 |
| 4,818,892 | 4/1989 | Oohashi et al. ............. | 307/106 |
| 4,894,494 | 1/1990 | Rosl et al. ................. | 200/11 R |
| 5,006,725 | 4/1991 | Nawaki et al. ............... | 307/106 |
| 5,010,255 | 4/1991 | Hilal et al. ................. | 307/106 |
| 5,118,969 | 6/1992 | Ikezi et al. ................. | 307/106 |
| 5,185,586 | 2/1993 | Zucker ...................... | 307/106 |

*Primary Examiner*—Richard T. Elms
*Attorney, Agent, or Firm*—William G. Auton

[57] ABSTRACT

Complex and multi-cycle microwave pulse waveforms are generated by the transient discharge of an induction charged transmission line using only one fast switch. An essential feature of the transmission line circuit is the distinction between the ground planes of the bias circuit and the microwave circuit. This distinction permits spatial variation of the charge induced on the transmission line over sections of ground plane biased at different potentials. Rapid discharge of the biased ground plane sections produces a complex or multiple cycle voltage wave on the transmission line which results in multicycle microwave pulse generation. The transient discharge is initiated by a fast switch located in the microwave ground plane. The similarity between some operating characteristics of the herein described device and the traditional Frozen Wave Generator (FWG) justify naming the new device and Induction Charged Frozen Wave Generator (ICFWG).

2 Claims, 3 Drawing Sheets

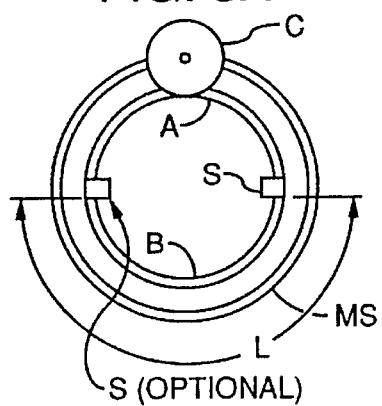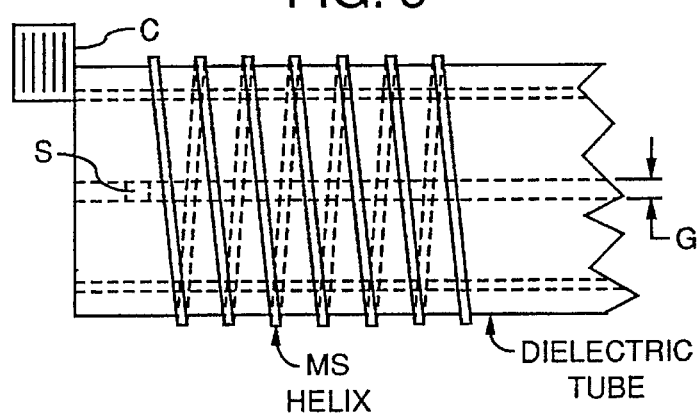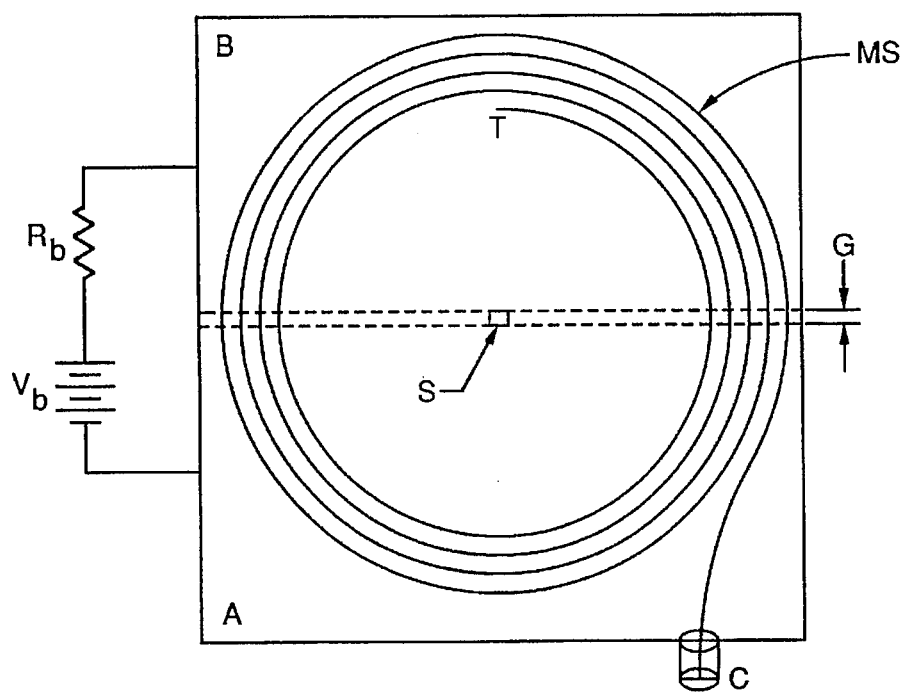

INDUCTION CHARGE MICROWAVE PULSE GENERATOR HAVING A SPLIT GROUND PLANE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to pulse forming generators, and more specifically the invention pertains to a source of high peak-power microwave pulses of short duration for high resolution radar systems. The invention is not limited to the "microwave" region of the spectrum. It will operate at any frequency if built to proper scale.

The generation of short pulses of microwave power at frequencies around $GH_z$ and above has been accomplished largely by magnetrons, klystrons, and frequency multipliers. Klystrons are generally low power output devices. Magnetrons are highly precise, expensive devices. In both, generally as operating frequencies are increased, the structure size needs to be decreased with reduction in the ability of the device to dissipate heat, thereby placing a practicable limit on both the available power output and on the frequency attainable.

While further extension into shorter wave lengths is possible with frequency multipliers which typically use crystals to distort a generated wave, the power derived from the harmonics falls off very rapidly with increasing frequencies.

The task of generating high peak-power microwave pulses of short duration is alleviated, to some extent, by the systems described in the following U.S. Patents, the disclosures of which are incorporated herein by reference:

U.S. Pat. No. 5,118,969 issued to Ikezi et al;

U.S. Pat. No. 5,006,725 issued to Nawaki et al;

U.S. Pat. No. 5,010,255 issued to Hilal et al;

U.S. Pat. No. 4,894,494 issued to Rosl et al;

U.S. Pat. No. 4,818,892 issued to Oohashi et al; and

U.S. Pat. No. 3,484,619 issued to Proud.

The patent to Nawaki et al discloses a pulse generating unit including a delay unit for delaying an input signal of the pulse generating unit and a comparator unit for comparing an output signal of the delay unit with the above mentioned input signal. The patent to Oohashi et al discloses a laser with a high voltage pulse generator wherein the pulse generator supplies electric energy from a DC power source in an on-off form from a supply voltage to a tank circuit through a transformer, with the switching on and off of the supply voltage being effected in synchronism with the resonance period of the tank circuit. The remaining patents are of similar interest.

Useful amounts of power at wave lengths shorter than 5 mm. have been obtained from spark equipment using resonating dipoles in an insulating fluid. In such devices, a resonant dipole, typically spherical, is spaced between a pair of electrodes. A spark discharge across a gap between the electrode and the resonator excites the natural oscillation of the latter by causing a sudden collapse of the electrical field. The sparks are accompanied by damped trains of waves of random phase. Such devices are, therefore, broad-band radio emitters, and have limited power output. Attempts have been made to increase the number of resonant dipoles by arranging them in long series arrays to increase the power output. While the latter does increase it is not at all in proportion to the added number of dipoles. Also spark gaps have been mounted in microwave cavities, the latter being intended to serve as a resonant filter. Such devices are theoretically high efficiency devices but actually exhibit low power outputs. All of the foregoing devices can be termed harmonic generators in that they are oscillating devices controlled by a resonant element which establishes the fundamental frequency.

SUMMARY OF THE INVENTION

The present invention is an induction charge microwave pulse generator. One embodiment of the invention is a system for producing a complex and multi-cycle microwave pulse waveform generated by a transient discharge of an induction charged transmission line using only one fast switch.

One essential feature of the induction charged transmission line circuit is the distinction between the ground planes of the bias circuit and the microwave circuit. This distinction permits spatial variation of the charge induced on the transmission line by multiple overlap of the conductors in the microwave pulse generation circuit. The transient discharge is initiated by a fast switch located in the microwave ground plane. The new device described above is an Induction Charged Frozen Wave Generator (ICFWG). A critical characteristic of the ICFWG is its ability to form a complex wave with only one switch. However, more than one switch may be placed in series or parallel combination to respectively increase the potential or current carrying capacity of the circuit without affecting the ICFWG's basic waveforming function.

It is an object of the present invention to produce high peak-power microwave pulses.

It is another object of the invention to generate multiwave microwave pulse waveforms of short duration.

These objects together with other objects, features and advantages of the invention will become more readily apparent from the following detailed description when taken in conjunction with the accompanying drawings wherein like elements of the present invention are given like reference numerals throughout.

DESCRIPTION OF THE DRAWINGS

FIG. 3 is an illustration of an helical coil ICFWG of the present invention;

FIG. 3A is a cross sectional view of FIG. 3; and

FIGS. 4–6 are views of planar spiral microstrip lines overlapping two or more ground plane segments in the present invention.

DETAILED DESCRIPTION OF THE PREFERRED EMBODIMENT

The present invention generates complex and multi-cycle microwave pulse waveforms by a transient discharge of an induction charged transmission line using only one fast switch. An essential feature of the induction charged transmission line circuit is the distinction between the ground planes of the bias circuit and the microwave circuit. This distinction permits spatial variation of the charge induced on the transmission line by multiple overlap of the conductors of the microwave pulse generation circuit. The transient discharge is initiated by a fast switch located in the microwave ground plane. The new device described above is an Induction Charged Frozen Wave Generator (ICFWG). A critical characteristic of the ICFWG is its ability to form a complex wave with only one switch. However, more than one switch may be placed in series or parallel combination to respectively increase the potential or current carrying capacity of the circuit without affecting the ICFWG's basic waveforming function.

Figure 1:
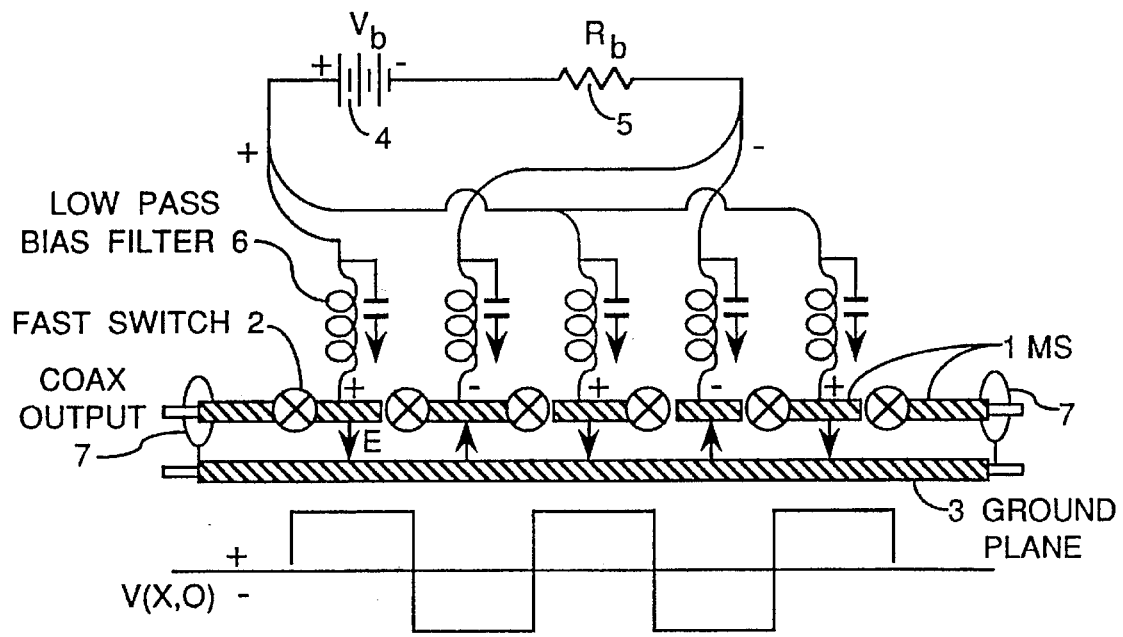
FIG. 1 is an illustration of the circuit and pulse waveforms of a prior art frozen wave generator.

Relevant prior technology is the "FROZEN WAVE GENERATOR" (FWG), so called for its initial static potential distribution which becomes a traveling wave when initially open switches are closed to activate the circuit. The general configuration of a FWG is shown in FIG. 1, using microstrip transmission line media. Other media such as coax, co-planar waveguide and stripline are also appropriate. Here we show a simple serially connected transmission line with several segments of line (1) separated by fast switches (2) and over ground plane (3). Biasing (4) is applied through isolation resistor (5) and low pass filters (6). Microstrip to coaxial output connectors (7) are located at both ends. Even this simple circuit which is well known in the prior art can be operated to produce many different pulse shapes depending on, 1) the bias potential of each line segment, 2) the length of each line segment, 3) the timing of closure of the switches. In addition, various more complex combinations of series and parallel circuits may be used to extend the complexity of the produced pulse shape.

If we consider the operation of the circuit in FIG. 1 under conditions where the line segments are equal length, a static bias potential ($V_b$) is established on serially connected equal length transmission line segments separated by fast switches. A plot of line potential ($V_b(x,t)$) as a function of distance along the line (x) at time (t)=0 describes the initial "frozen" or static waveform. Here we use a simple alternating bias potential so each switch must withstand a voltage difference of 2 Vb. Simultaneously closing all switches at t=0 results in the formation of a continuous transmission line allowing discharge of the bias in both directions along the line. Straight forward analysis of the transient behavior of the transmission line response shows, $$V(x,t) = \tfrac{1}{2} Vb(x,0)(x-vt) + \tfrac{1}{2} Vb(x,0)(x+vt) \quad (1)$$

where $v=(LC)^{-1/2}$, v is the velocity of the ± traveling wave components and L and C are the inductance and capacitance per unit length respectively of the transmission line.

The dominant frequency of the pulse spectrum ($f_c$) follows directly from the frozen wave period λ, λ/2=D where D is the length of the line segment, and the velocity of the traveling wave, $$f_c = v/\lambda = (LC)^{-1/2}/2D; \text{ or } D=(LC)^{-1/2}/2f_c. \quad (2)$$

Under ideal lossless conditions the peak power of the pulses (P) traveling out either end from such a capacitative FWG is easily calculated. It is one half the total energy (E) stored at t=0 divided by the pulse duration (T), or alternatively, the squared amplitude of the voltage wave (Vb)/2 divided by the microstrip line impedance (Z).

$$P = E/2T; \text{ or } = Vb^2/4Zo \quad (3)$$

In principle FWG devices are very versatile and are based on a well understood technology. However, they have found limited application primarily because they require many near-perfect fast switches to be precisely controlled to produce a useful pulse output. Also, as shown above in Eq. (3), the amount of microwave power generated is proportional to the square of the potential applied across the switches. The need of approximately one switch for each cycle of generated microwave signal leads to the requirement of many switches to make a complex or multi-cycle wave. The requirement of many switches each subject to large potential difference is disadvantageous in both reducing reliability and increasing cost. Another significant disadvantage is the extensive control network needed for activation of many fast switches. At high microwave frequencies the preferred fast switch is optically activated and thus a beam of light or optical fiber must be brought to each switch and precisely coupled, which is not a trivial task. At lower microwave or radio frequencies, where electrical activation might by chosen rather than optical, an even more extensive wire control network is needed.

Figure 2:
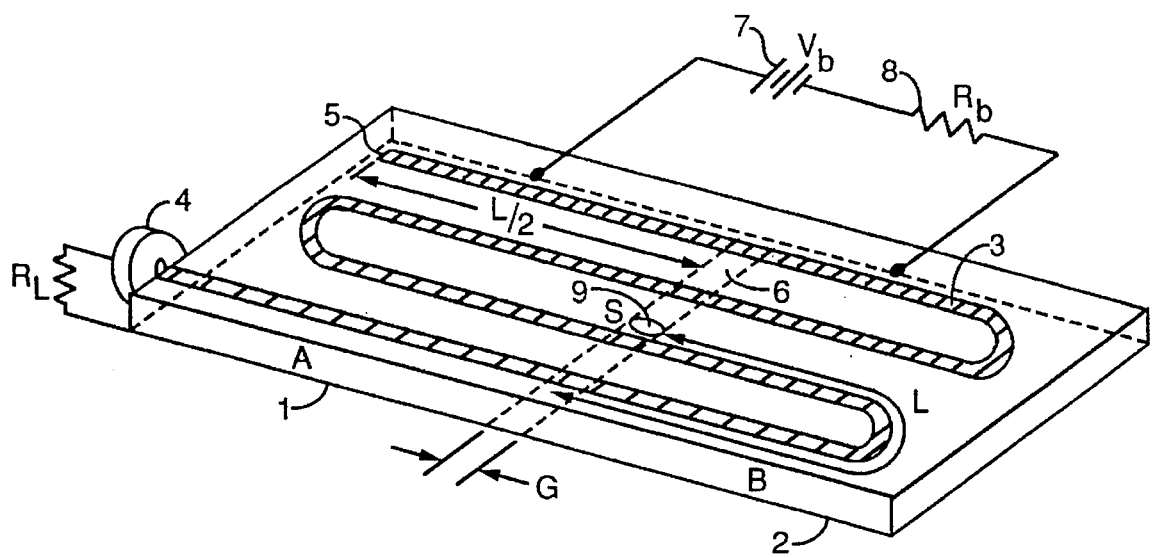
FIG. 2 is an illustration of an embodiment of the present invention.

The form of the ICFWG depends on the particular waveform to be generated, as will be shown by the following examples. The form of the ICFWG for generating an approximately N cycle square wave using microstrip medium is illustrated in FIG. 2. The split ground plane sections (1) and (2) are labeled A and B. The closely spaced serpentine microstrip line (3) alternately overlaps each section with equal lengths L and does so 2N times. The word "closely" in the previous sentence means mutually adjacent parts of the serpentine microstrip should be as close to each other as possible without experiencing significant coupling which will adversely effect the desired output waveform. For some waveforms, however, coupling between or among transmission lines may be desirable. The output connector (4) is located on ground plane section A and the ICFWG device is operated in the reflection mode with the microstrip line internally terminated with a high impedance open circuit at (5). This termination could also be connected to another output connector. In this configuration a common reference electric potential ground of zero volts is established at the outer shield of the coax output connector and ground plane A. Ground plane B is closely adjacent to A, with a gap (6) in the ground plane surface conductors of G, sufficient to prevent electrical breakdown from the bias potential (7) of Vb applied through isolation resistor Rb(8). A fast switch S (9) is connected between ground plane sections A and B near the location of the closely spaced microstrip crossings of the gap G.

ICFWG devices can operate usefully in a variety of circuit contexts, but to illustrate the generic operating principles we will confine the discussion to the device shown in FIG. 2. It is essential to understand the initial static electrical charge and potential distribution of the ICFWG device just before time t=0 at which time the initially open fast switch is closed. The potential of ground plane A and the entire length of microstrip line MS overlapping both ground planes A and B is zero. The potential of ground plane B is biased at Vb. This assumes that sufficient time has elapsed since any prior circuit disturbance so that equilibrium has been established. Although the potential along microstrip MS is constant, the charge distribution is not. The static electric charge induced on the microstrip is different in the line over ground plane section A than over section B. Also, the charge distribution on ground plane B is not uniform. This follows from simple electrostatic theory. The charge (Q) on a section of line is equal to the product of bias potential (Vb) times the capacitance (Cl) between the line section and ground plane, or $$Q = Vb * Cl \quad (5)$$

When the fast switch S is closed at t=0 the bias potential of ground planes A and B near the switch are "short circuited" and the potential of A and B go to the same value of zero over their extent in a very short transient time (Tt). As the ground plane B potential goes to zero, the charge on the microstrip line forces the potential of all N of the sections overlapping ground plane B to go to minus Vb. While all N of the microstrip sections overlapping ground plane A remain at zero potential because they had no initial induced charge. Thus, immediately (or more exactly time Tt) after the switch closing, the potential measured along the length of microstrip is a periodic function alternating 2N times between zero and −Vb. This can be viewed as the creation of a frozen potential wave of N cycles having a spatial period of 2 L along the line. This will result, subsequently, in a traveling wave with a time period (Tp) of $2D/(LC)^{1/2}$ from Eq. 2 above, where Tp is the reciprocal of $f_c$. If the last segment of the microstrip line over ground plane A is made of length D/2 and internally terminated with a high impedance open circuit, the reflected wave will be properly phased to follow the direct wave through the output connector to form a uniform periodic pulse of 2N cycles.

A large variety of wave shapes can be created using this basic ICFWG form by changing the circuit parameters such as; L, C, Z, Zo, Vb, N, D. The techniques of pulse shaping by adjusting line length, line impedance, bias potential and terminating impedance as well as the other parameters are well known to people skilled in the art.

The ICFWG is described using microstrip transmission line circuits which are well suited for fabrication and testing the ICFWG, however, other types of transmission line media may also be used. The output waveform is conducted out of the microstrip device via impedance matched coaxial cable (coax) which is a customary and well known technique. The electrical connection between the coax connector shield and adjacent microstrip ground plane is always made a very good low impedance connection for the wave, however, capacitive dc blocks can be used that allow potential differences below certain frequencies for bias and dc off-set of the output wave.

ICFWG devices are inherently bilateral, that is one half the frozen or initial potential distribution travels in each direction along the line. If one has connectors at both ends, each traveling wave component is separately conducted from the device each on its own coax. However, if one end is terminated with an unmatched impedance, part or all, of the respective wave component will be reflected back through the ICFWG circuit and exit the impedance matched connector end following the other wave component. It should be clear that this unmatched termination can be made internal to the ICFWG device and therefore only one connector need be used for this reflection mode type of operation.

A critical characteristic of the ICFWG is its ability to form a complex wave with only one switch. However, more than one switch may be placed in series or parallel combination to respectively increase the potential or current carrying capacity of the circuit without affecting the ICFWG's basic waveforming function. The ICFWG is therefore not limited to using only one switch.

This description uses optically activated reverse biased microwave PIN diodes as the switch because, at present, they are the fastest and can best withstand the large potential difference applied to achieve high power output. Use of other types of switches, even electrically activated, is possible especially at lower microwave or radio frequencies.

A very significant design constraint on the ICFWG is the condition that Tt must be much less than Tp for the device to produce a simply predictable waveform. If transient time Tt cannot be considered insignificant compared to the desired waveform period Tp, then the output waveform will be a complex combination of the discharge of the frozen wave charge along the line and the transient discharge of the bias charge on the ground plane. This does not negate the usefulness of the ICFWG, but makes the circuit design and analysis needed to produce useful and predictable pulse shapes more complicated.

A primary advantage of the ICFWG is the ability to predictably create a complex or multiple cycle potential wave on a transmission line at an instant in time (a so called Frozen Wave), using a novel split ground plane microwave circuit and one fast switch. Prior methods require approximately one switch for each wave cycle or waveform inflection and therefore need many switches and extensive associated control means to synthesize a multi-cycle wave. Multicycle or complex waveforms are desirable to localize the output wave energy within a specified frequency band, or in other words, to allow the spectral distribution of the wave energy to be controlled.

There are many useful alternate forms of the ICFWG for making special wave-shapes. In addition to the form shown in FIG. 2, two other forms are of special interest, both because they produce useful waveforms and, also, serve to show basic methods to extend the functionality of the ICFWG. The first is a helical microstrip transmission line wound overlapping a split cylindrical ground "plane", and uses one or more fast switches, as shown in FIG. 3. The second is a planar spiral microstrip line overlapping two or more ground plane segments and uses one or more fast switches, as shown in FIG. 4. The term "one or more fast switch" is used in describing the alternate forms because additional switches, placed at strategic points may speed up the ground plane transient response (reduce Tt). However, the basic waveform generated does not depend on using more than one fast switch. Other forms will be obvious for synthesizing special waveforms using these principles.

The helical form of FIGS. 3 and 3a has two sections of ground plane A and B each being approximately a half-cylinder of equal circumferential arc. The sections A and B are separated by gaps of width G on opposite sides of the cylinder and parallel to its axis. These sections, for instance, could be on the inside surface of a hollow dielectric cylinder serving as a circuit substrate. A fast switch is placed across the gap on at least one side of the cylinder. A second switch (S optional), placed across the second gap, will reduce the transient discharge time (Tt) of the ground plane sections. Reducing Tt will improve the details of the wave shape dependent on Tt being very short. However, the second switch is not necessary for making the basic wave shape. The cylinder is made long enough axially to allow several turns of microstrip to be wound helically, passing alternately over Sections A and B. The length of microstrip line L determining the wavelength is measured along the helix. This form evolves from the one of FIG. 2 when the planar substrate is bent into a cylinder, leaving a second gap between the nearly joining edges of the ground plane sections. Therefore, in this helical form, the serpentine line, of FIG. 2, is rather would helically around the cylinder instead of folding back. The microstrip and ground plane surfaces could also be interchanged with the microstrip inside and the ground planes outside the dielectric tube. This form is advantageous for reducing the size by wrapping the plane into a cylinder. Also, for making long multicycle waves, especially at low frequencies where line lengths are large, fabricating the ICFWG on a dielectric tube may offer some advantage.

Figure 5:
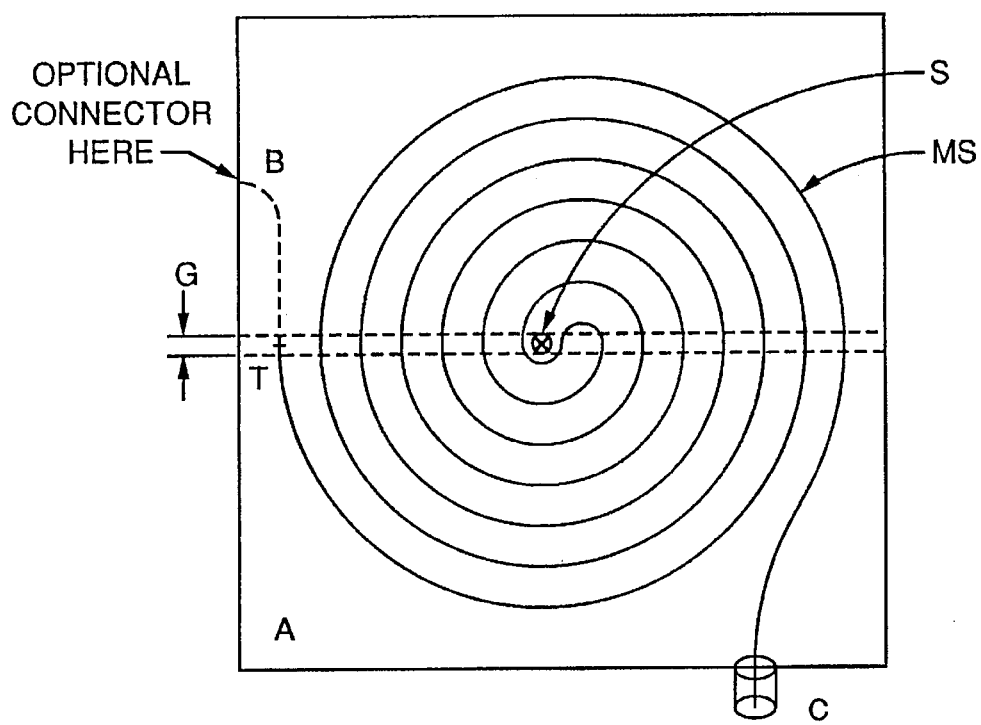

A spiral form of the ICFWG is shown in FIG. 4. This example demonstrates waveshaping to create frequency shifting or chirping of the output signal. This configuration has two bias ground plane sections A and B. The spacing between spiral legs is shown equal but need not be. When the switch S closes one traveling wave component goes toward the connector, the other component goes toward the termination T. The first output wavelength is long, determined by the long segment of spiral microstrip nearest the connector C. Successive cycles get shorter, approximately linearly, until the connector-going wave part initially at the termination T passes the connector. If the termination is an open circuit, the termination-going component is reflected as a mirror image of the connector-going wave, reversed in time, which immediately follows the connector-going component out the connector. The termination-going component may also be totally absorbed in an impedance matched load at T or partially reflected using an appropriate termination. The upper and lower excursions of the output frequency are easily determined from equation (2) above. It is obvious that if the extent of the spiral is confined to have all line segments approximately equal length the frequency excursion will be small. A double spiral form is shown in FIG. 5 shows how access to both ends of the microstrip line is possible for some ICFWG configurations.

Figure 6:
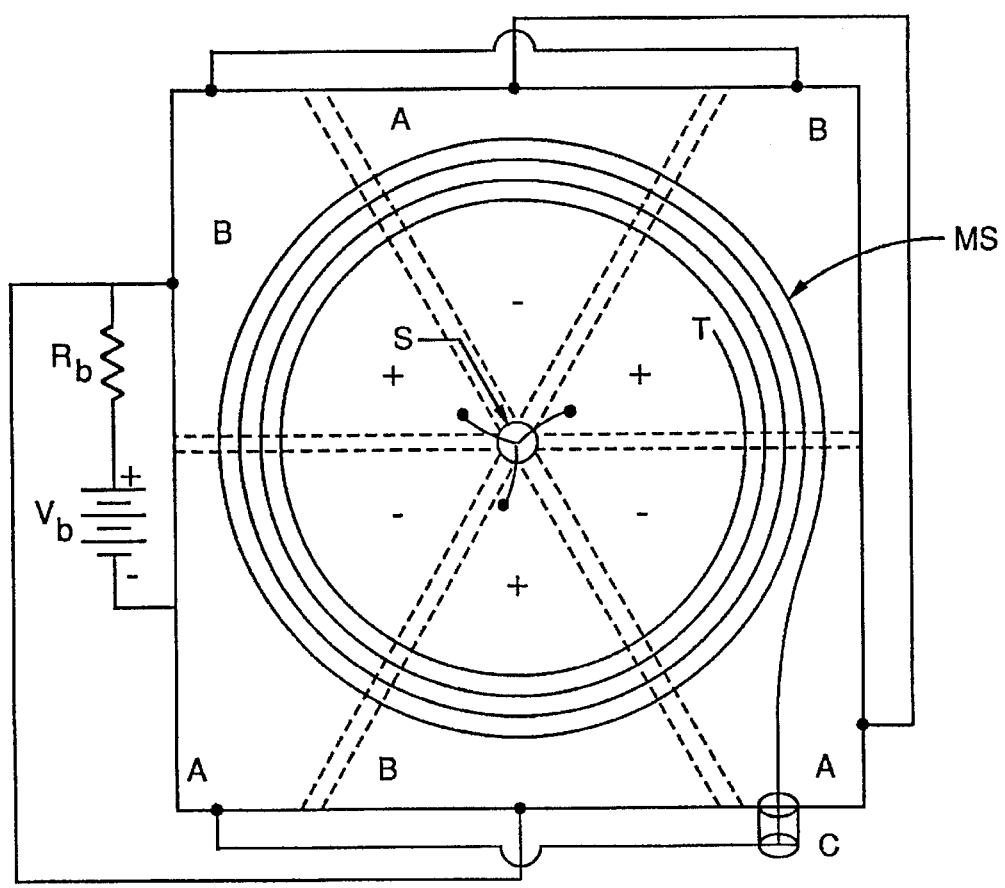

To create specialized waveforms, ICFWG devices may have many sections of bias ground plane of different size biased at different potentials with different transmission line configuration. The spiral form is a good example. The number of bias ground planes can be increased, as shown in FIG. 6, by making several pie shaped sections. If an even number (Ne) of equal arc, alternately biased sections are used, the output frequency and frequency range will be increased a factor of Ne/2 over the two section ICFWG of FIG. 4. The circuit connection to the switch at the apex of the pie sectors is routine. The above examples are sufficient to show some of the many possible forms of the ICFWG.

The present invention is a source of high peak-power microwave pulses of short duration are very useful for high resolution radar. Some practical applications include munitions fusing, target signature, tactical radar, ground penetrating radar and radar clutter reduction. Commercial applications include vehicle collision avoidance, vehicle identification, materials characterization, non-destructive testing and ground penetrating radar.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. An induction charge microwave pulse generator comprising:

a split ground plane with a first and second section separated by a gap;

a microwave transmission line media which outputs a microwave pulse when an induction charge is induced substantially along its entire length, wherein said microwave transmission line media comprises a conductive helical coil which encircles the split ground plane in a series of coils;

a means for producing a voltage potential difference between the first and second sections of the split ground plane; and a switch which is placed in said gap between the first and second sections of the split ground plane to electrically connect them so that the voltage potential difference becomes approximately proportional to said induction charge which is induced substantially along the entire length of the microwave transmission line media so that the microwave pulse is produced thereby.

2. An induction charge microwave pulse generator, as defined in claim 1, wherein said producing means comprises:

a voltage source which is electrically connected to the first and second sections of the split ground plane; and a means for electrically connecting said voltage source with a predetermined electrical impedance to the first and second sections of the split ground plane.

* * * * *